(12) United States Patent
Suganuma et al.

(10) Patent No.: US 12,094,850 B2
(45) Date of Patent: Sep. 17, 2024

(54) BONDING STRUCTURE PRODUCTION METHOD AND BONDING STRUCTURE (71) Applicant: OSAKA UNIVERSITY, Osaka (JP)

(72) Inventors: Katsuaki Suganuma, Suita (JP); Chuantong Chen, Suita (JP); Zheng Zhang, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 395 days.

(21) Appl. No.: 17/595,826

(22) PCT Filed: May 28, 2020

(86) PCT No.: PCT/JP2020/021086
§ 371 (c)(1),
(2) Date: Nov. 24, 2021

(87) PCT Pub. No.: WO2020/241739
PCT Pub. Date: Dec. 3, 2020

(65) Prior Publication Data
US 2022/0230988 A1 Jul. 21, 2022

(30) Foreign Application Priority Data
May 29, 2019 (JP) .................... 2019-100287

(51) Int. Cl.
H01L 23/00 (2006.01)
(52) U.S. Cl.
CPC .............. *H01L 24/83* (2013.01); *H01L 24/29* (2013.01); *H01L 24/32* (2013.01);
(Continued)

(58) Field of Classification Search
CPC ......... H01L 24/29; H01L 24/83; H01L 24/32; H01L 21/52; H01L 24/27; H01L 2224/29499; H01L 2924/05432; H01L 2224/29394; H01L 2224/32227; H01L 2224/83192; H01L 2224/29339; H01L 2224/32; H01L 2224/83487;
(Continued)

(56) References Cited

U.S. PATENT DOCUMENTS 9,382,477 B2 * 7/2016 Ueda ............... C09K 11/77348
10,504,749 B2 12/2019 Nishimoto et al.
(Continued)

FOREIGN PATENT DOCUMENTS

JP 2017-157599 A 9/2017
JP 2018-116995 A 7/2018

Primary Examiner — Mouloucoulaye Inoussa
(74) Attorney, Agent, or Firm — Studebaker & Brackett PC (57) ABSTRACT A bonding structure production method for producing a bonding structure (100) includes at least bonding a semiconductor element (30) and a substrate (10) using a silver paste. The substrate (10) includes a die attachment portion (12) to which the semiconductor element (30) is to be bonded. The die attachment portion (12) includes an alumina layer (16) serving as a surface layer on a bonding side of the die attachment portion (12) to which the semiconductor element (30) is to be bonded. The silver paste contains a solvent and silver particles with a residual strain measured by X-ray diffractometry of at least 5.0%. Preferably, the silver particles have a volume-based 50% cumulative diameter of at least 100 nm and no greater than 50 μm.

11 Claims, 8 Drawing Sheets (52) U.S. Cl.
CPC .............. *H01L 2224/29339* (2013.01); *H01L 2224/29394* (2013.01); *H01L 2224/29499* (2013.01); *H01L 2224/32227* (2013.01); *H01L 2224/83192* (2013.01); *H01L 2224/83395* (2013.01); *H01L 2224/83487* (2013.01); *H01L 2224/8384* (2013.01); *H01L 2924/05432* (2013.01)

(58) Field of Classification Search
CPC ... H01L 2224/8384; H01L 2224/83395; H01L 2224/83097; H01L 2224/2731; H01L 2224/29294; H01L 2224/2732; H01L 2224/83193; H01L 2224/83092; H01L 2224/05582; H01L 2224/32225; H01L 2224/0345; B22F 3/11; B22F 7/08; B22F 1/10; B22F 7/064; B22F 7/004; B22F 1/054; B22F 9/04; B22F 9/24; B22F 1/0655; B22F 1/06; B22F 1/065; B22F 2301/255; C22C 1/0466; C22C 1/08; C22C 5/06; B32B 15/16; B32B 5/16; B32B 9/048; B32B 3/26; B32B 15/20; B32B 15/01; B32B 2307/732; B32B 2307/542; B32B 2457/202; B32B 2255/205; B32B 2457/08; B32B 2250/03; B23K 35/001; B23K 35/025; B23K 35/3006; B23K 20/021; B23K 20/24; B23K 20/023; B23K 20/16; B23K 2101/40; C09D 5/24; C09D 11/52; H01B 1/22; A61L 27/425; A61L 27/54; A61L 27/56; A61L 27/12; A61L 2430/02; A61L 2300/404; A61L 2430/12; A61L 2400/12; A61L 2300/104; C04B 35/447; C04B 2235/408; C04B 2235/443; C04B 2235/652; C04B 2235/5427; C04B 2235/5436; C04B 2235/666; C04B 2235/85; G01N 21/658; C01B 25/32; A61K 6/838; B23F 1/02; C22F 1/14
USPC .............. 257/773, 655, 703, 762, E29.109, 257/E23.109, E23.113, E23.009; 438/125
See application file for complete search history.

(56) References Cited

U.S. PATENT DOCUMENTS

| | | | |
|---|---|---|---|
| 2005/0094381 A1* | 5/2005 | Imamura | C04B 35/5935 257/E23.113 |
| 2009/0039477 A1* | 2/2009 | Kaga | H05K 1/0306 257/E29.109 |
| 2009/0121588 A1* | 5/2009 | Yamaguchi | C01G 33/006 310/358 |
| 2011/0074010 A1* | 3/2011 | Kuromitsu | B23K 1/0016 257/E23.109 |
| 2014/0158858 A1* | 6/2014 | Yamao | C30B 29/06 249/115 |
| 2015/0115452 A1* | 4/2015 | Yoon | H01L 24/29 228/256 |
| 2015/0255419 A1* | 9/2015 | Nishimoto | C04B 37/026 257/773 |
| 2016/0060516 A1* | 3/2016 | Sumino | C09K 11/77348 252/301.4 F |
| 2017/0294404 A1* | 10/2017 | Inoue | B22F 7/08 |
| 2018/0085830 A1* | 3/2018 | Lou | B22F 10/366 |
| 2019/0027380 A1 | 1/2019 | Nishimoto et al. | |
| 2019/0177229 A1* | 6/2019 | Ikoma | A61L 27/425 |
| 2020/0039007 A1* | 2/2020 | Suganuma | H01L 24/83 |
| 2020/0156158 A1* | 5/2020 | Kim | B22F 9/04 |
| 2020/0376545 A1* | 12/2020 | Masuyama | B22F 3/11 |
| 2022/0347745 A1* | 11/2022 | Jiu | H01L 24/83 |
| 2022/0396853 A1* | 12/2022 | Matsunaga | C22F 1/08 |
| 2023/0260946 A1* | 8/2023 | Jun | C22C 1/0466 428/425.9 |
| 2023/0377800 A1* | 11/2023 | Hoshino | H01G 4/0085 |

* cited by examiner

BONDING STRUCTURE PRODUCTION METHOD AND BONDING STRUCTURE

TECHNICAL FIELD

The present invention relates to a bonding structure production method for producing a bonding structure that constitutes at least a part of a semiconductor module and a bonding structure.

BACKGROUND ART

As a constituent member of a semiconductor module, a DBA (registered Japanese trademark) substrate is known. The DBA substrate includes a ceramic base that is electrically insulating and an aluminum circuit layer formed on at least one of the main surfaces of the ceramic base. The aluminum circuit layer includes a die attachment portion on which a semiconductor element is to be mounted.

The surface layer of the die attachment portion of the DBA substrate is typically an alumina layer (specifically, an alumina layer formed through oxidation of aluminum by oxygen in the air). In a case in which a semiconductor element is bonded directly to the die attachment portion of the DBA substrate using silver paste, the surface layer (alumina layer) of the die attachment portion inhibits diffusion of silver which is a constituent component of the silver paste. This leads to difficulty in increasing bonding strength between the semiconductor element and the die attachment portion.

In view of the foregoing, in order to bond using silver paste a semiconductor element and a substrate (also referred to below as aluminum-based substrate) including the die attachment portion with a surface layer that is an alumina layer, such as a DBA substrate, the bonding is typically performed after a metal layer is formed on the surface of the alumina layer.

For example, in Patent Literature 1, after an underlying metal layer (also referred to below as metalized layer) made of for example silver is formed on the die attachment portion of the aluminum-based substrate by plating or sputtering, a semiconductor element and the metalized layer are bonded using silver paste. When the semiconductor and the die attachment portion with the metalized layer formed thereon are bonded using the silver paste, silver which is a constituent component of the silver paste diffuses in the metalize layer to enable increase in bonding strength between the semiconductor element and the die attachment portion (also referred to below simply as "bonding strength").

CITATION LIST

Patent Literature

[Patent Literature 1] Japanese Patent Application Laid-Open Publication No. 2018-116995

SUMMARY OF INVENTION

Technical Problem

However, the production method disclosed in Patent Literature 1 necessitates an additional step of forming the metalized layer, leading to difficulty in reduction in manufacturing costs.

The present invention has been made in view of the foregoing and has its object of providing a method for producing a bonding structure that can provide ensured high bonding strength and that can reduce manufacturing costs even the method includes bonding a semiconductor element and an aluminum-based substrate. Another object of the present invention is to provide a bonding structure that can ensure high bonding strength.

Solution to Problem

A bonding structure production method according to the present invention is a method for producing a bonding structure that constitutes at least a part of a semiconductor module. The bonding structure production method according to the present invention incudes at least bonding a semiconductor element and a substrate using a silver paste. The substrate includes a die attachment portion to which the semiconductor element is to be bonded. The die attachment portion includes an alumina layer serving as a surface layer on a bonding side of the die attachment portion to which the semiconductor element is to be bonded. The silver paste contains a solvent and silver particles with a residual strain measured by X-ray diffractometry of at least 5.0%.

In one embodiment, the silver particles have a volume-based 50% cumulative diameter of at least 100 nm and no greater than 50 µm.

In one embodiment, a percentage content of the silver particles in the silver paste is at least 85% by mass and no greater than 95% by mass relative to a total mass of the silver paste.

In one embodiment, the silver particles have a residual strain measured by the X-ray diffractometry of no greater than 20.0%.

In one embodiment, the silver particles are flakey silver particles.

In one embodiment, the semiconductor element includes no metalized layer that serves for bonding to the substrate.

In one embodiment, the bonding includes: applying; forming a layered body; and heating. In the applying, the silver paste is applied onto the die attachment portion of the substrate. In the forming a layered body, the semiconductor element is superposed on the die attachment portion with the silver paste therebetween. In the heating, the layered body is heated.

In one embodiment, the layered body is heated without pressure application in the heating.

In one embodiment, the layered body is heated at a temperature of 150° C. or higher and 350° C. or lower in the heating.

A bonding structure according to the present invention is a bonding structure that constitutes at least a part of a semiconductor module. The bonding structure according to the present invention includes: a semiconductor element; a substrate; and a bonding layer that bonds the semiconductor element and the substrate. The substrate includes a die attachment portion to which the semiconductor element is bonded. The die attachment portion includes an alumina layer serving as a surface layer on a bonding side of the die attachment portion to which the semiconductor element is bonded. The bonding layer includes porous silver sintered bodies and silver nanoparticles with a number average primary particle diameter of at least 1 nm and no greater than 20 nm.

At least a portion of the silver nanoparticles is bonded to the alumina layer.

Advantageous Effects of Invention

According to the bonding structure production method of the present invention, which even includes the bonding a semiconductor element and an aluminum-based substrate, manufacturing costs can be reduced and ensured high bonding strength can be provided. Also, according to the bonding structure of the present invention, high bonding strength can be ensured.

BRIEF DESCRIPTION OF DRAWINGS

[FIGS. 1A, 1B, 1C, and 1D]

DESCRIPTION OF EMBODIMENTS

The following describes preferable embodiments of the present disclosure. However, the present invention is not limited to the following embodiments and can be practiced in various ways within the scope not deviating from the gist thereof. It should be noted that some overlapping explanations may be omitted as appropriated.

The terms used in the present specification will be described first. The term "flakey silver particles" refer to silver particles with a shape different from a spherical shape, and silver particles with a flat plate shape (specific examples include a leafy shape and a squamous shape), for example. Note that "spherical shape" includes a shape of sphere and a spherical shape (specific examples include an oblate shape) other than the shape of sphere.

The term "porous silver sintered bodies" refers to porous sintered bodies obtained by sintering an aggregation of silver particles at a temperature lower than the melting point of the silver particles.

The term "volume-based 50% cumulative diameter" refers to a particle diameter at which the cumulative frequency from the small particle diameter side reaches 50% in a particle size distribution in terms of volume (volume particle size distribution) in terms of volume. In the following, the volume-based 50% cumulative diameter may be referred to as "volume median diameter ($D_{50}$)". Measured values for volume median diameter ($D_{50}$) of particles (specifically, a powder of particles) are median diameters as measured using a zeta potential/particle diameter measuring system ("ELSZ-1000ZS", product of Otsuka Electronics Co., Ltd.) unless otherwise stated. Measured values for number average primary particle diameter of particles refers to number average values of equivalent circle diameters (diameters of circles with the same areas as areas of sections of the primary particles) of sections of 100 primary particle as measured using a transmission electron microscope ("JEM-2100", product of JEOL Ltd., accelerating voltage: 200 kV) unless otherwise stated.

A "main component" of a material refers to a component contained the most in the material in terms of mass unless otherwise stated.

In the following, a residual strain as measured by X-ray diffractometry may be referred to simply as "residual strain". Also, a solvent and a dispersion medium are each referred to as "solvent" in the present specification.

First Embodiment: Bonding Structure Production Method

The following describes a bonding structure production method for producing a bonding structure (specifically, a bonding structure that constitutes at least a part of a semiconductor module) according to a first embodiment of the present invention with reference to the accompanying drawings. Note that the drawings schematically illustrate elements of configuration in order to facilitate understanding and properties of elements of configuration illustrated in the drawings, such as size, number, and shape, may differ from actual properties thereof in order to facilitate preparation of the drawings.

An outline of the bonding structure production method according to the first embodiment will be described first with reference to FIGS. 1A to 1D. FIGS. 1A to 1D are cross-sectional views of examples of individual processes of the bonding structure production method of the first embodiment. The bonding structure production method of the first embodiment incudes: preparing a substrate; and bonding a semiconductor element 30 (see FIG. 1C) and a substrate 10 (see FIG. 1A) using a silver paste. Additionally, the bonding in the first embodiment includes applying, forming a layered body, and heating.

Figure 1A:
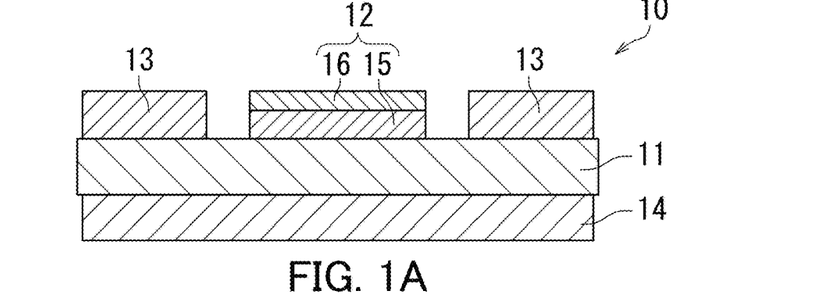
FIGS. 1A, 1B, 1C, and 1D are cross-sectional views of examples of individual processes of a bonding structure production method according to a first embodiment of the present invention.

In the preparing a substrate, a substrate 10 is prepared as illustrated in FIG. 1A. The substrate 10 includes a base 11 that is electrically insulating, a die attachment portion 12 formed on one of the main surfaces of the base 11, and a front-side metal layer 13. A later-described semiconductor element 30 (see FIG. 1C) is to be bonded to the die attachment portion 12. Furthermore, the substrate 10 further includes a rear-side metal layer 14 formed on the other main surface on the opposite side of the base 11 to the main surface on which the die attachment portion 12 is formed.

The die attachment portion 12 includes a die attachment main part 15 formed on the base 11 and an alumina layer 16 present on a main surface of the die attachment main part 15 on the opposite side to the side of the base 11. That is, the die attachment portion 12 includes the alumina layer 16 serving as a surface layer on a bonding side of the die attachment portion 12 to which the semiconductor element 30 (see FIG. 1C) is to be bonded. The interface between the die attachment main part 15 and the alumina layer 16 may be definitely specified or cannot be definitely specified. Note that the bonding side of the die attachment portion 12 that is to be bonded to the semiconductor element 30 (main surface of the alumina layer 16 on the side opposite to the die attachment main part 15) is a surface to which a silver paste is to be applied.

Figure 1B:
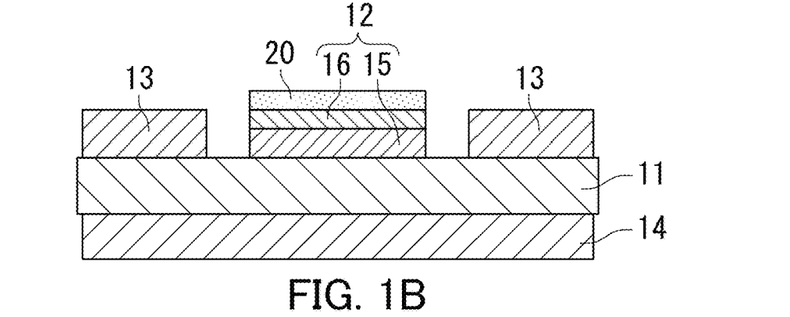

In the applying, the silver paste is applied onto the die attachment portion 12 (specifically, the alumina layer 16) of the substrate 10 to form an application film 20 made of the silver paste as illustrated in FIG. 1B. The silver paste to be applied onto the alumina layer 16 contains a solvent and silver particles with a residual strain measured by X-ray diffractometry of at least 5.0%. The method for measuring a residual strain of the silver particles is the same as that described later in Examples or a method conforming thereto. Hereinafter, silver particles with a residual strain measured by X-ray diffractometry of at least 5.0% may be referred to as specific silver particles.

After the applying and before the forming a layered body, heating the application film 20 may be performed in order to remove at least a portion of the solvent contained in the application film 20.

Figure 1C:
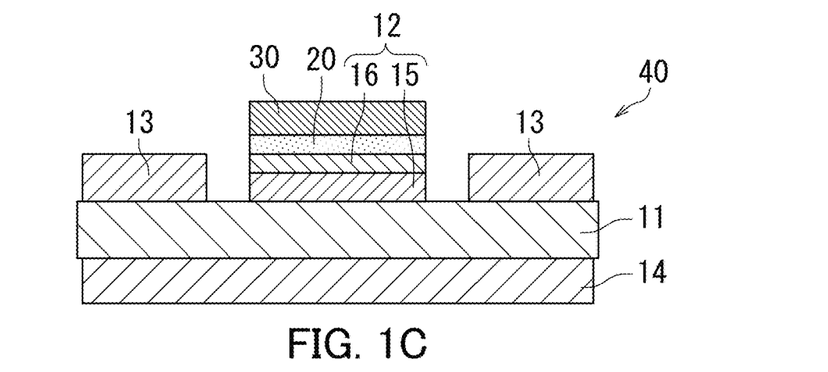

In the forming a layered body, the semiconductor element 30 is superposed on the die attachment portion 12 with the application film 20 made of the silver paste therebetween to form a layered body 40 as illustrated in FIG. 1C.

Figure 1D:
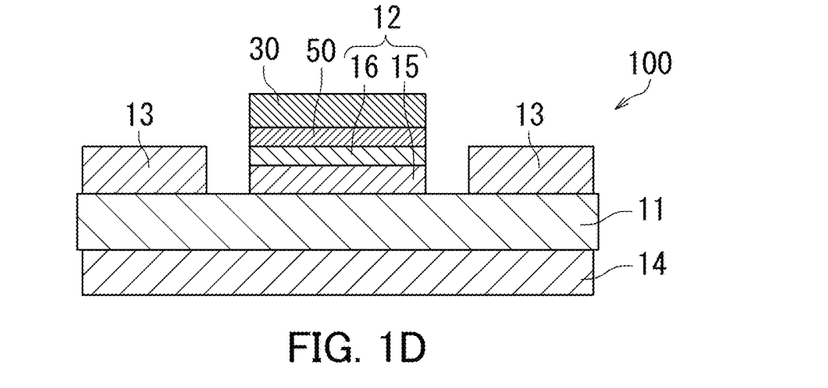

In the heating, the layered body 40 obtained through the forming a layered body is heated. As a result of the layered body 40 being heated, the specific silver particles in the application film 20 (see FIG. 1C) are sintered together to form a bonding layer 50 (see FIG. 1D) that bonds the semiconductor element 30 and the die attachment portion 12. Through the above, a bonding structure 100 illustrated in FIG. 1D is obtained.

Each process included in the bonding structure production method according to the first embodiment will be described next in detail.

[Preparing Substrate]

The substrate 10 prepared in the preparing a substrate includes a base 11 that is electrically insulating. No particular limitations are placed on a constituent material of the base 11 as long as it is an electrically insulating material, and examples of the constituent material include glass, silicon, resin, and a ceramic material. In a case in which the bonding structure 100 obtained by the production method of the first embodiment is used in a power semiconductor module (semiconductor module for power control), the constituent material of the base 11 is preferably a ceramic material and more preferably at least one selected from the group consisting of silicon nitride and aluminum nitride in order to increase heat dissipation. The base 11 has a thickness of at least 0.1 mm and no greater than 10 mm, for example.

Examples of a constituent material of the die attachment main part 15 formed on one of the main surfaces of the base 11 include aluminum (generally called 2N aluminum) with a purity of at least 99.00% by mass, aluminum (generally called 3N aluminum) with a purity of at least 99.90% by mass, aluminum (generally called 4N aluminum) with a purity of at least 99.99% by mass, and an aluminum alloy. The die attachment main part 15 has a thickness of at least 0.1 mm and no greater than 5 mm, for example.

The alumina layer 16 present on one of the main surfaces of the die attachment main part 15 is an oxide film obtained through oxidation (natural oxidation) of aluminum present in the surface portion of the die attachment main part 15 by oxygen in the air, for example. The alumina layer 16 has a thickness of at least 1 nm and no greater than 10 nm, for example. Note that the alumina layer 16 may be an oxide film intentionally formed by heating the surface of the die attachment main part 15 in the air.

The alumina layer 16 may contain a component (specific examples include water) other than alumina. However, the percentage content of alumina in the alumina layer 16 is preferably at least 60% by mass relative to the total mass of the alumina layer 16 in order to inhibit corrosion of the die attachment main part 15, more preferably at least 80% by mass, further preferably at least 90% by mass, and particularly preferably 100% by mass.

Examples of a constituent material of the front-side metal layer 13 formed on one of the main surfaces of the base 11 include aluminum, aluminum alloy, copper silver, gold, palladium, and nickel. The constituent material of the front-side metal layer 13 may be the same as or different from the constituent material of the die attachment main part 15. In a case in which the constituent material of the front-side metal layer 13 is aluminum or an aluminum alloy, the surface layer of the front-side metal layer 13 on the opposite side to the base 11 is typically an alumina layer (not illustrated). The front-side metal layer 13 has a thickness of at least 0.1 mm and no greater than 5 mm, for example.

Examples of a constituent material of the rear-side metal layer 14 formed on the main surface on the opposite side of the base 11 to the die attachment portion 12 include aluminum, aluminum alloy, copper, silver, gold, palladium, and nickel. The constituent material of the rear-side metal layer 14 may be the same as or different from the constituent material of the die attachment main part 15. In a case in which the rear-side metal layer 14 is aluminum or an aluminum alloy, the surface layer of the rear-side metal layer 14 on the opposite side to the base 11 is typically an alumina layer (not illustrated). The rear-side metal layer 14 has a thickness of at least 0.1 mm and no greater than 5 mm, for example.

As the substrate 10 in the first embodiment, a substrate 10 produced for example by a known method may be used or a commercially available one may be used. Examples of the commercially available substrate 10 include a DBA substrate.

[Applying]

The silver paste used in the applying contains the specific silver particles and a solvent. The specific silver particles have a volume median diameter ($D_{50}$) of preferably at least 100 nm and no greater than 50 μm, more preferably at least 1.0 μm and no greater than 10.0 μm, and further preferably at least 1.0 μm and no greater than 5.0 μm. As a result of the specific silver particles having a volume median diameter ($D_{50}$) of at least 100 nm, adjustment of the residual strain of the specific silver particles to at least 5.0% can be facilitated. As a result of the specific silver particles having a volume median diameter ($D_{50}$) of no greater than 50 μm by contrast, bonding strength can be further increased.

In application of the silver paste onto the die attachment portion 12 by printing, the percentage content of the specific silver particles in the silver paste is preferably at least 85% by mass and no greater than 95% by mass relative to the total mass of the silver paste in order to facilitate formation of the application film 20 onto the die attachment portion 12, and more preferably at least 90% by mass and no greater than 95% by mass. Note that the silver paste may contain silver particles other than the specific silver particles. However, the percentage content of the specific silver particles in the silver paste is preferably at least 50% by mas relative to the total mass of silver particles in the silver paste in order to further increase bonding strength, more preferably at least 80% by mass, and particularly preferably 100% by mass.

In order to further increase bonding strength, the residual strain of the specific silver particles is preferably at least 10.0%. Furthermore, in order to stably maintain the crystal structure of the specific silver particles in the silver paste, the residual strain of the specific silver particles is preferably no greater than 20.0%, and more preferably no greater than 15.0%.

In order to further increase bonding strength, it is preferable that the specific silver particles have a residual strain of at least 10.0% and no greater than 15.0% and a volume median diameter ($D_{50}$) of at least 1.0 µm and no greater than 5.0 µm and it is more preferable that the specific silver particles have a residual strain of at least 11.0% and no greater than 14.0% and a volume median diameter ($D_{50}$) of at least 2.0 µm and no greater than 4.0 µm.

The specific silver particles may be flakey silver particles, for example. The flakey silver particles with residual strain can be obtained for example by stirring spherical silver particles obtained by reducing a silver compound (specific examples include silver salt) with a reducing agent using a stirrer (specific examples include a ball mill). The residual strain and the volume median diameter ($D_{50}$) of the flakey silver particles can be adjusted for example by changing stirring a condition (specific examples include stirring speed and stirring time) in stirring using the stirrer.

Examples of the solvent contained in the silver paste include alcohols and solvents having an ether bond (also referred to below as ether-based solvent). Examples of the ether-based solvent include ethers and glycol ethers. As the solvent contained in the silver paste, one solvent may be used independently or two or more solvents may be used in combination.

Examples of ethers that can be used when an ether is used as the solvent of the silver paste include diisopropyl ether, tetrahydrofuran, and 1,4-dioxane.

Examples of glycol ethers that can be used when a glycol ether is used as the solvent of the silver paste include ethylene glycol monomethyl ether, diethylene glycol monomethyl ether, ethylene glycol monoethyl ether, diethylene glycol monoethyl ether, ethylene glycol monobutyl ether, diethylene glycol monobutyl ether, propylene glycol monomethyl ether, dipropylene glycol monomethyl ether, diethylene glycol monohexyl ether, and diethylene glycol mono 2-ethylhexyl ether.

Examples of alcohols that can be used when an alcohol is used as the solvent of the silver paste include 1-propanol, 2-propanol, 1-butanol, 2-methyl-1-propanol, 2-butanol, 2-methyl-2-propanol, 1-pentanol, 1-octanol, and 2-octanol.

Note that the silver paste used in the applying may further contain a component (additional component) other than the specific silver particles and the solvent. Examples of the additional component include a dispersant for increasing dispersibility of the specific silver particles in the silver paste.

A method for applying the silver paste onto the die attachment portion 12 is not limited specifically and may be printing or potting, for example. In order to easily form the application film 20 on the die attachment portion 12, printing (specific examples include screen printing) is preferable as the method for applying the silver paste onto the die attachment portion 12.

[Forming Layered Body]

Examples of the semiconductor element 30 used in the forming a layered body include a semiconductor element (also referred to below as Si semiconductor element) of which main component is silicon, a semiconductor element of which main component is silicon carbide, a semiconductor element of which main component is gallium nitride, a semiconductor element of which main component is silicon nitride, and a semiconductor element of which main component is aluminum nitride.

In order to further reduce manufacturing costs, the semiconductor element 30 preferably includes no metalized layer that serves for bonding to the substrate 10. The semiconductor element 30 and the substrate 10 are bonded using the silver paste containing the specific silver particles in the first embodiment. As such, bonding strength between the semiconductor element 30 and the substrate 10 can be increased even when the semiconductor element 30 includes no metalized layer.

[Heating]

Examples of a method for heating the layered body 40 in the heating include a method for heating the layered body 40 using a hot plate and a method for heating the layered body 40 using a heating furnace.

A heating temperature in heating the layered body 40 is not limited specifically as long as it is a temperature at which the specific silver particles in the application film 20 are sintered together, and may be 100° C. or higher and 400° C. or lower, for example. In order to further increase bonding strength, the heating temperature in heating the layered body 40 is preferably 150° C. or higher and 350° C. or lower. Note that the heating rate until the temperature reaches the heating temperature is at least 10° C./min. and no greater than 20° C./min., for example. Furthermore, in order to further increase bonding strength, the heating time (time for keeping the heating temperature) in heating the layered body 40 is preferably 15 minutes or longer and 5 hours or shorter, and more preferably 30 minutes or longer and 3 hours or shorter.

Heating of the layered body 40 may be performed under atmospheric pressure or under reduced pressure. Moreover, heating of the layered body 40 may be performed in the air or in an inert gas (specific examples include argon and nitrogen) atmosphere.

In the heating, the layered body 40 may be heated without pressure application or heated under pressure application to the layered body 40. In order to inhibit breakage of the semiconductor element 30, the layered body 40 is preferably heated without pressure application in the heating. The semiconductor element 30 and the substrate 10 are bonded using the silver paste containing the specific silver particles in the first embodiment. As such, bonding strength between the semiconductor element 30 and the substrate 10 can be increased even when no pressure is applied to the layered body 40 in the heating.

The bonding layer 50 obtained by sintering the specific silver particles together in the application film 20 through the heating has a thickness of at least 1 µm and no greater than 100 µm, for example. The thickness of the bonding layer 50 can be adjusted for example by changing the percentage content of the specific silver particles in the silver paste used in the applying.

The semiconductor element 30 and the substrate 10 (aluminum-based substrate) are bonded with no metalized layer provided on the alumina layer 16 in the bonding structure production method of the first embodiment, which can eliminate the need to provide a process of forming a metalized layer. Therefore, the manufacturing costs can be reduced according to the bonding structure production method of the first embodiment.

Furthermore, high bonding strength can be ensured according to the bonding structure production method of the first embodiment. A reason thereof can be presumed as follows.

In the first embodiment, residual strain of the specific silver particles in the application film 20 is eased in the heating. When the residual strain of the specific silver particles is eased, fine silver nanoparticles are generated at dislocation sites (crystal defect sites) in the crystals of the specific silver particles.

Figure 2:
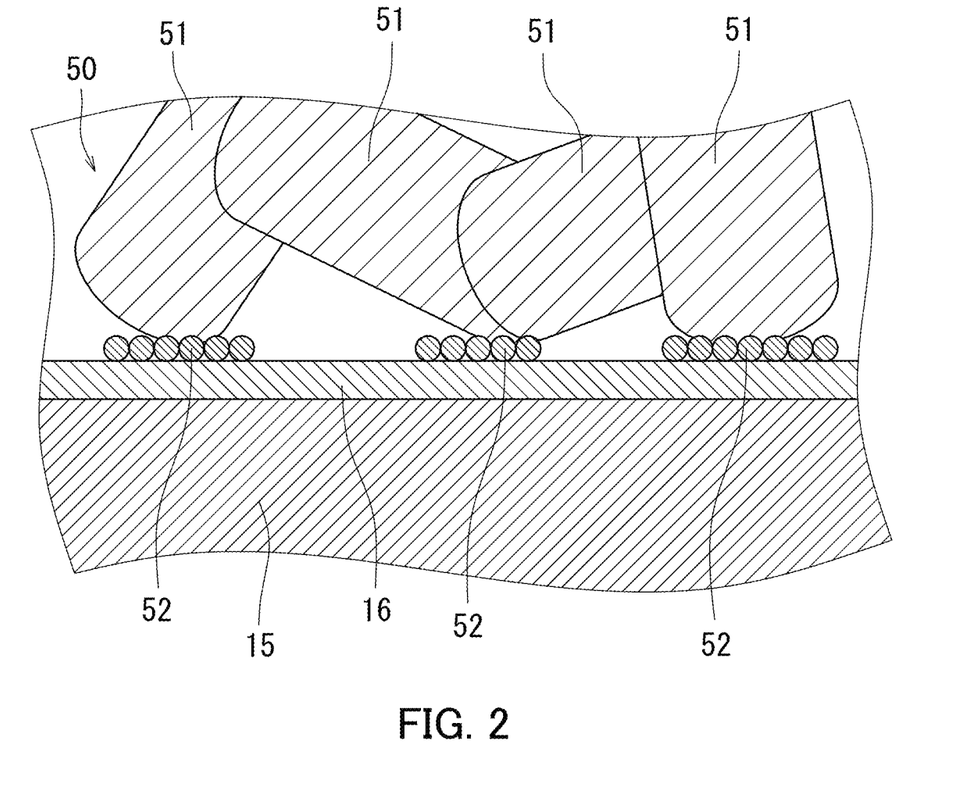
FIG. 2 is a partial cross-sectional view of an example of a bonding structure produced by the production method of the first embodiment of the present invention.

The following describes the silver nanoparticles generated at the dislocation sites of the specific silver particles with reference to FIG. 2. FIG. 2 is a partial cross-sectional view (specifically, a partial cross-sectional view of an example of a bonding part of the bonding structure 100) of an example of the bonding structure 100 obtained through the heating. As illustrated in FIG. 2, the bonding layer 50 includes porous silver sintered bodies 51 and silver nanoparticles 52. The porous silver sintered bodies 51 are formed by sintering the specific silver particles together in the heating. The silver nanoparticles 52 are generated at dislocation sites of the silver particles.

The silver nanoparticles 52 have a number average primary particle diameter of for example at least 1 nm and no greater than 20 nm, preferably at least 5 nm and no greater than 15 nm, and more preferably at least 8 nm and no greater than 12 nm. The generated silver nanoparticles 52 have higher surface free energy than the specific silver particles, and accordingly function as a bonding agent for bonding the porous silver sintered bodies 51 to the alumina layer 16. This can increase bonding strength between the bonding layer 50 and the alumina layer 16. Therefore, ensured high bonding strength can be provided according to the bonding structure production method of the first embodiment.

The bonding structure 100 obtained by the production method of the first embodiment is processed into a semiconductor module through a process of electrically connecting the semiconductor element 30 and the front-side metal layer 13 and a process of bonding the rear-side metal layer 14 and a heat dissipating member (not illustrated), for example. Note that the bonding structure 100 obtained by the production method of the first embodiment may be used as a semiconductor module.

The bonding structure production method of the first embodiment has been described so far. However, the bonding structure production method of the present invention is not limited to the first embodiment described above.

For example, the bonding included in the bonding structure production method of the first embodiment includes the applying, the forming a layered body, and the heating as described with reference to FIGS. 1A to 1D. However, the bonding in the bonding structure production method of the present invention is not limited specifically as long as a semiconductor element and a substrate are bonded using the above-described specific silver paste.

Furthermore, the bonding structure production method of the first embodiment includes the preparing a substrate. However, the preparing a substrate is unnecessary in a case in which implementation of the bonding structure production method of the present invention starts in a state in which a substrate is prepared in advance.

Second Embodiment: Bonding Structure

The following describes a bonding structure (specifically, a bonding structure constituting at least a part of a semiconductor module) according to a second embodiment of the present invention with reference to FIGS. 1A to 1D and 2. The bonding structure according to the second embodiment is a bonding structure for example obtained by the bonding structure production method according to the first embodiment described above. In the following, explanations of the contents overlapping with the first embodiment described above are omitted.

A bonding structure 100 (see FIG. 1D) according to the second embodiment includes a semiconductor element 30 (see FIG. 1C), a substrate 10 (see FIG. 1A), and a bonding layer 50 (see FIG. 1D) that bonds the semiconductor element 30 and the substrate 10.

The substrate 10 includes a die attachment portion 12 (see FIG. 1A) to which the semiconductor element 30 is bonded. Furthermore, the die attachment portion 12 includes an alumina layer 16 serving as a surface layer on a bonding side of the die attachment portion 12 to which the semiconductor element 30 is bonded.

As illustrated in FIG. 2, the bonding layer 50 includes porous silver sintered bodies 51 and silver nanoparticles 51. The porous silver sintered bodies 51 are formed by sintering the specific silver particles together in an application film 20 (see FIG. 1B). The silver nanoparticles 52 have a number average primary particle diameter of at least 1 nm and no greater than 20 nm. At least a portion of the silver nanoparticles 52 are bonded to the alumina layer 16.

The silver nanoparticles 52 have a number average primary particle diameter of at least 1 nm and no greater than 20 nm. In order to ensure further high bonding strength, the silver nanoparticles 52 have a number average primary particle diameter of preferably at least 5 nm and no greater than 15 nm, and more preferably at least 8 nm and no greater than 12 nm. The number average primary particle diameter of the silver nanoparticles 52 can be adjusted for example by changing the volume median diameter ($D_{50}$) of the specific silver particles.

The silver nanoparticles 52 have higher surface free energy than the specific silver particles, and therefore function as a bonding agent for bonding the porous silver sintered bodies 51 and the alumina layer 16. This can increase bonding strength between the bonding layer 50 and the alumina layer 16. Therefore, high bonding strength can be ensured in the bonding structure of the second embodiment.

EXAMPLES

The following describes examples of the present invention. However, the present invention is not limited to the scope of the examples. Note that scanning electron microscope (SEM) photos each were taken under a condition of an accelerating voltage of 5 kV using a SEM ("SU8020", product of Hitachi High-Technologies Corporation). Also, transmission electron microscope (TEM) photos each were taken under a condition of an accelerating voltage of 200 kV using a TEM ("JEM-2100", product of JEOL Ltd.).

Furthermore, a residual strain of silver particles (specifically, either flakey silver particles FP or spherical silver particles SP described later) was calculated from an interplanar spacing of the crystal lattice of the silver particles (a powder) obtained by X-ray diffractometry. The residual strain measuring method is described below.

<Method for Measuring Residual Strain of Silver Particles>

First, an X-ray diffraction spectrum of a powder (sample) of silver particles was plotted under the following measurement conditions using a curved imaging plate X-ray diffraction system ("RINT (registered Japanese trademark) RAPID II", product of Rigaku Corporation).

Characteristic X-rays: Cu-Kα rays ($\lambda$=1.5418 Å)
Tube voltage: 40 kV
Tube current: 30 mA
Measurement range (2θ): 0 degrees or more and 160 degrees or less
Scanning speed: 1 degree/sec.

Next, an interplanar spacing of each of the (111) plane, the (200) plane, and the (220) plane of the crystal lattice of the sample was calculated based on the plotted X-ray diffraction spectrum using integrated X-ray powder diffraction software ("PDXL Ver. 2.0", product of Rigaku Corporation). In the following, the calculated interplanar spacing of the (111) plane is referred to as d1, the calculated interplanar spacing of the (200) plane is referred to as d2, and the calculated interplanar spacing of the (220) plane is referred to as d3.

Next, a residual strain ε1 (unit: %) was calculated from d1 and the interplanar spacing (also referred to below as $d1_0$) of the (111) plane of silver crystals with no residual strain using the following formula (1). Also, a residual strain ε2 (unit: %) was calculated from d2 and the interplanar spacing (also referred to below as $d2_0$) of the (200) plane of the silver crystals with no residual strain using the following formula (2). In addition, a residual strain ε3 (unit: %) was calculated from d3 and the interplanar spacing (also referred to below as $d3_0$) of the (220) plane of the silver crystals with no residual strain using the following formula (3).

$$\text{Residual strain } \varepsilon 1 = 100 \times (d1 - d1_0)/d1_0 \quad (1)$$

$$\text{Residual strain } \varepsilon 2 = 100 \times (d2 - d2_0)/d2_0 \quad (2)$$

$$\text{Residual strain } \varepsilon 3 = 100 \times (d3 - d3_0)/d3_0 \quad (3)$$

Subsequently, an arithmetic mean of the residual strain ε1, the residual strain ε2, and the residual strain ε3 was calculated and the calculated average value was taken to be a residual strain (unit: %) of the sample.

<Silver Particle Preparation>

Figure 3:
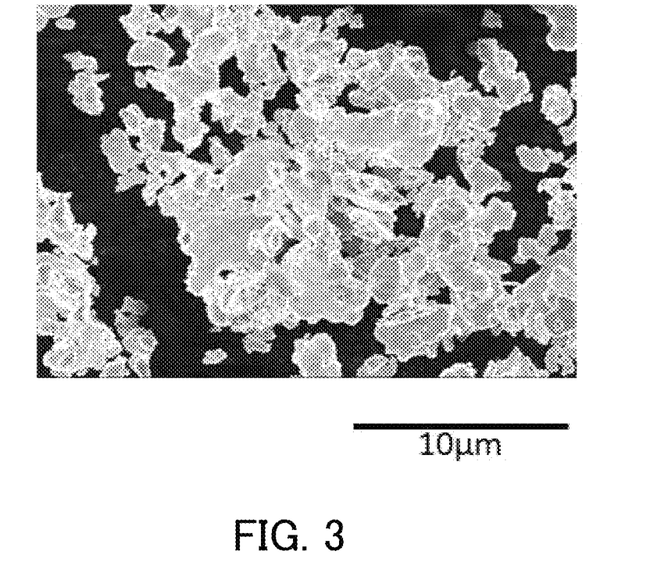
FIG. 3 is a scanning electron micrograph of an example of flakey silver particles.
Figure 4:
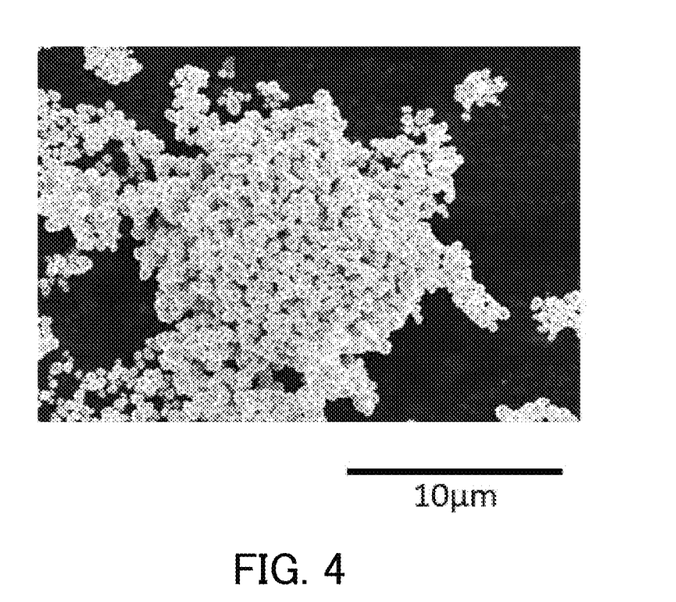
FIG. 4 is a scanning electron micrograph of an example of spherical silver particles.

Flakey silver particles FP and spherical silver particles SP were prepared as silver particles used for later-described silver pastes. The flakey silver particles FP were particles "SILCOAT (registered Japanese trademark) Ag C-239" (product of Fukuda Metal Foil & Powder Co., Ltd., volume median diameter ($D_{50}$): 3.0 μm, residual strain: 12.5%). The spherical silver particles SP were particles "S211A-10" (product of DAIKEN CHEMICAL CO., LTD., volume median diameter ($D_{50}$): 320 nm, residual strain: 0%). FIG. 3 is a SEM photo of the flakey silver particles FP. Also, FIG. 4 is a SEM photo of the spherical silver particles SP. Note that the same results as above were obtained even in measurement of a volume median diameter ($D_{50}$) and a residual strain of a powder of flakey silver particles FP as a measurement target obtained by removing a solvent from a silver paste used in production of a later-described bonding structure SA-1. Likewise, the same results as above were obtained even in measurement of a volume median diameter ($D_{50}$) and a residual strain of a powder of spherical silver particles SP as a measurement target obtained by removing a solvent from a silver paste used in production of a later-described bonding structure SB-1.

Figure 5:
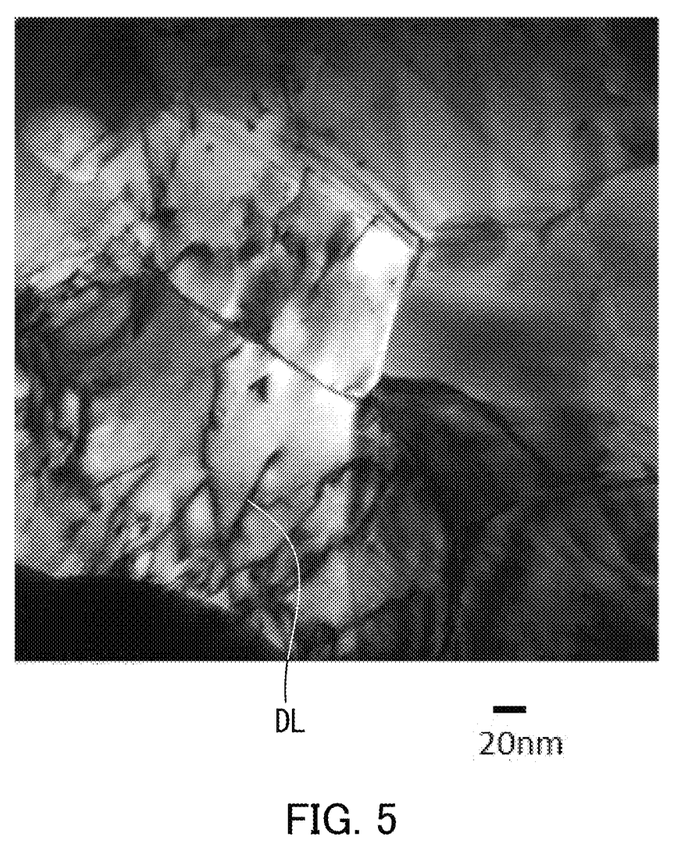
FIG. 5 is a transmission electron micrograph of an example of the flakey silver particles.

Furthermore, the flakey silver particles FP were observed using the TEM. FIG. 5 is a TEM photo of the flakey silver particles FP. As shown in FIG. 5, the flakey silver particles FP had dislocation sites (dislocation lines DL).

<Bonding Structure Production>

The following describes production methods of a bonding structure of Example 1 (also referred to below as bonding structure SA-1), a bonding structure of Example 2 (also referred to below as bonding structure SA-2), and a bonding structure of Comparative Example 1 (also referred to below as bonding structure SB-1). Note that a Si semiconductor element (Si semiconductor element with no metalized layer) with a size of 3 mm by 3 mm and a DBA substrate with a size of 10 mm by 10 mm were used as bonding targets in each production method of the bonding structures SA-1, SA-2, and SB-1.

[Production of Bonding Structure SA-1]

(Silver Paste Preparation)

A silver paste was obtained by mixing the flakey silver particles FP and an ether-based solvent ("CELTOL (registered Japanese trademark) IA", product of Daicel Corporation) at a mass ratio (flakey silver particles FP: ether-based solvent) of 12:1.

(Bonding)

The silver paste (silver paste obtained through the above-described preparation) was applied onto the die attachment portion of the DBA substrate by screen printing using a mask with a thickness of 100 μm (applying). Next, the Si semiconductor element was mounted on an application film formed of the printed silver paste, thereby obtaining a layered body (forming a layered body). Next, the resultant layered body was heated using a hot plate (heating). In the heating, the temperature of the heating section of the hot plate was increased at a heating rate of 15° C./min. under atmospheric pressure from room temperature (temperature of 25° C.) to 250° C. being the heating temperature with the layered body placed on the heating section of the hot plate, and kept at 250° C. for 60 minutes then. Note that the layered body was heated without pressure application. The bonding structure SA-1 was thus obtained by the production method described above.

[Production of Bonding Structure SA-2]

The bonding structure SA-2 was obtained according to the same method as that for the bonding structure SA-1 in all aspects other than the following change in the silver paste preparation.

(Silver Paste Preparation in Production of Bonding Structure SA-2)

A silver paste was obtained by mixing the flakey silver particles FP, the spherical silver particles SP, and an ether-based solvent ("CELTOL (registered Japanese trademark) IA", product of Daicel Corporation) at a mass ratio (flakey silver particles FP: spherical Silver Particles SP: Ether-Based Solvent) of 6:6:1.

[Production of Bonding Structure SB-1]

The bonding structure SB-1 was obtained according to the same method as that for the bonding structure SA-1 in all aspects other than the following change in the silver paste preparation.

(Silver Paste Preparation in Production of Bonding Structure SB-1)

A silver paste was obtained by mixing the spherical silver particles SP and an ether-based solvent ("CELTOL (registered Japanese trademark) IA", product of Daicel Corporation) at a mass ratio (spherical silver particles SP: ether-based solvent) of 12:1.

<Observation of Bonding Structure Using Electron Microscope>

[Observation Using SEM]

Figure 6:
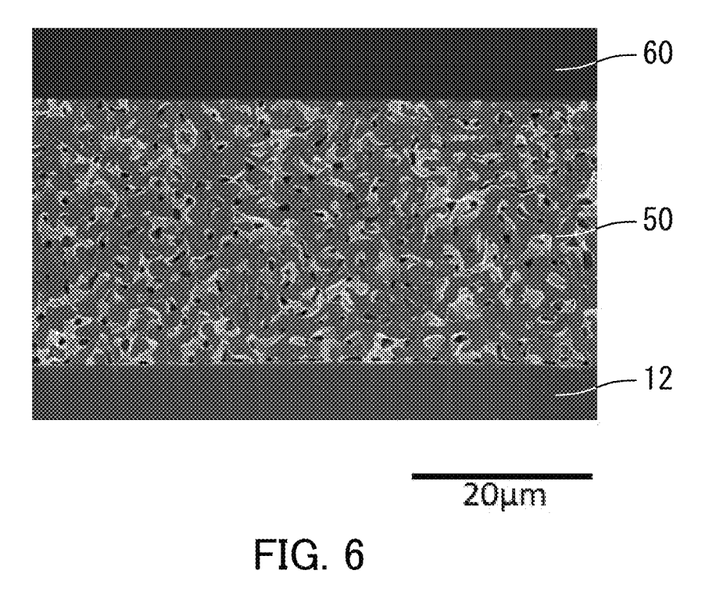
FIG. 6 is a scanning electron micrograph of a section of a bonding part of a bonding structure of Example 1.
Figure 7A:
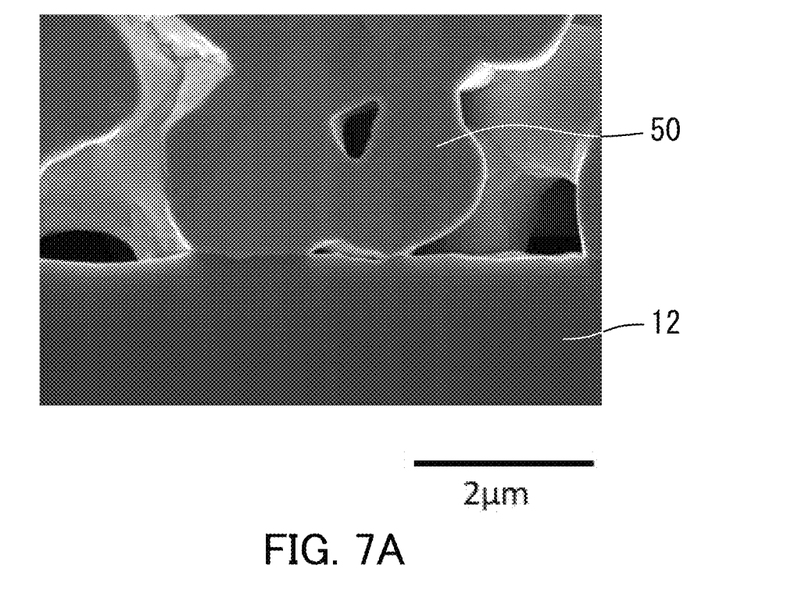
FIG. 7A is an enlarged scanning electron micrograph of a bonding part between a die attachment portion and a bonding layer in the section of FIG. 6.
Figure 7B:
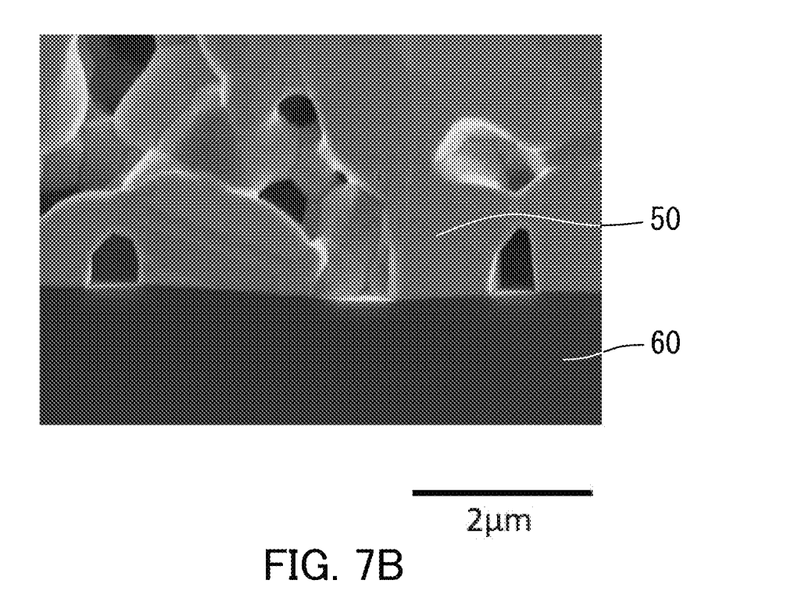
FIG. 7B is an enlarged scanning electron micrograph of a bonding part between a semiconductor element and the bonding layer in the section of FIG. 6.

The resultant bonding structure SA-1 was observed using the SEM. FIG. 6 is a SEM photo of a section of a bonding part of the bonding structure SA-1. As shown in FIG. 6, the Si semiconductor element 60 and the die attachment portion 12 were bonded with the bonding layer 50 therebetween in the bonding structure SA-1. Furthermore, bondability between the die attachment portion 12 and the bonding layer 50 was good as shown in FIG. 7A which is an enlarged SEM photo of the bonding part between the die attachment portion 12 and the bonding layer 50 in the section of FIG. 6. In addition, bondability between the Si semiconductor element 60 and the bonding layer 50 was good as shown in FIG. 7B which is an enlarged SEM photo of the bonding part between the Si semiconductor element 60 and the bonding layer 50 in the section of FIG. 6.

[Observation Using TEM]

Figure 8:
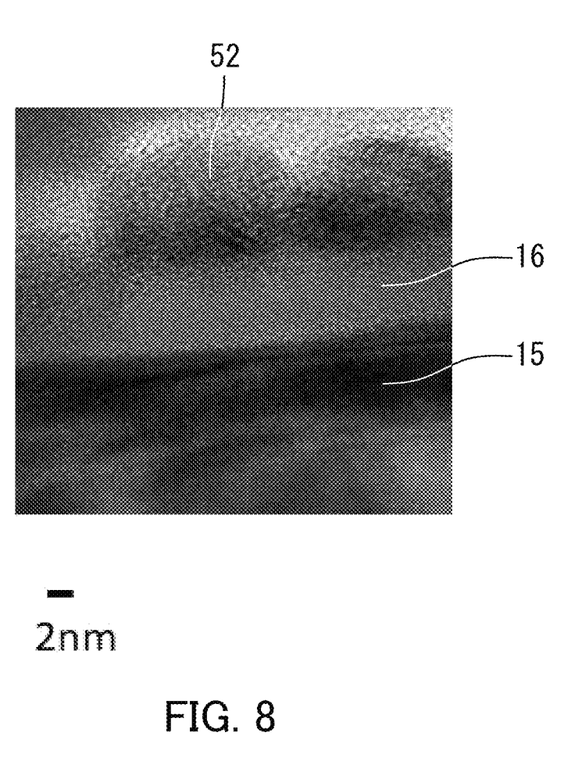
FIG. 8 is a transmission electron micrograph of a section of the bonding part of the bonding structure of Example 1.

The resultant bonding structure SA-1 was observed using the TEM. FIG. 8 is a TEM photo of a section of the bonding part of the bonding structure SA-1. As shown in FIG. 8, the bonding structure SA-1 included the silver nanoparticles 52 bonding to the alumina layer 16 formed on the die attachment main part 15. Furthermore, the silver nanoparticles 52 included in the bonding structure SA-1 had a number average primary particle diameter of 10 nm.

Although not shown, the bonding structure SA-2 also included the silver nanoparticles 52 bonding to the alumina layer 16. Furthermore, the silver nanoparticles 52 included in the bonding structure SA-2 had a number average primary particle diameter of 10 nm. By contrast, the bonding structure SB-1 did not include silver nanoparticles 52 with a number average primary particle diameter of at least 1 nm and no greater than 20 nm.

<Measurement of Bonding Structure Shear Strength>

[Measurement of Shear Strength of Bonding Structure SA-1]

A shear strength (shear strength between the Si semiconductor element 60 and the die attachment portion 12) of the bonding structure SA-1 was measured using a shear tester ("XD-7500", product of Nordson DAGE). Specifically, the shear strength (shear stress at shear fracture) was measured while shear force was applied to the Si semiconductor element 60 and the die attachment portion 12 using the shear tester. As a result, the measured shear strength was 34.7 MPa. Note that larger shear strength indicates higher bonding strength of a bonding structure.

Figure 9:
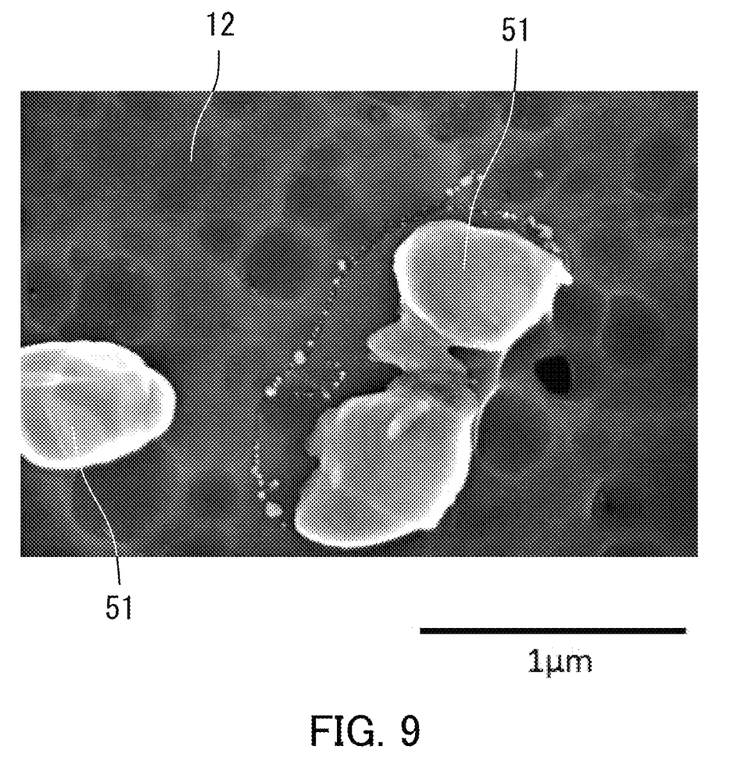
FIG. 9 is a scanning electron micrograph of the die attachment portion of the bonding structure of Example 1, after shear strength measurement, taken from the side where a silver paste is applied.

FIG. 9 is a SEM photo of the die attachment portion 12 after the shear strength measurement on the bonding structure SA-1. The SEM photo was taken from the side where the silver paste was applied. As shown in FIG. 9, the porous silver sintered bodies 51 remained in the surface portion of the die attachment portion 12. That is, a portion of the porous silver sintered bodies 51 bonded to the die attachment portion 12 in the bonding structure SA-1 even after the shear force was applied by the shearing tester.

[Measurement of Shear Strength of Bonding Structure SA-2]

A shear strength of the bonding structure SA-2 was measured under the same conditions as those in the measurement of the shear strength of the bonding structure SA-1 described above. As a result, the measured shear strength was 22.7 MPa.

[Measurement of Shear Strength of Bonding Structure SB-1]

A shear strength of the bonding structure SB-1 was measured under the same conditions as those in the measurement of the shear strength of the bonding structure SA-1 described above. As a result, the measured shear strength was 1.0 MPa.

The results of the shear strength measurement on the bonding structures SA-1, SA-2, and SB-1 demonstrated that according to the present invention, a bonding structure that can ensure high bonding strength can be provided.

Industrial Applicability

The bonding structure production method according to the present invention can be utilized for producing a bonding structure that constitutes at least a part of a semiconductor module. Also, the bonding structure according to the present invention can be utilized as a bonding structure that constitutes at least a part of a semiconductor module.

REFERENCE SIGNS LIST

10: substrate
12: die attachment portion
16: alumina layer
30: semiconductor element
40: layered body
50: bonding layer
51: porous silver sintered body
52: silver nanoparticle
100: bonding structure

The invention claimed is:

1. A bonding structure production method for producing a bonding structure that constitutes at least a part of a semiconductor module, comprising:
   providing a semiconductor element;
   providing a substrate including a die attachment portion to which the semiconductor element is to be bonded, the die attachment portion including an alumina layer serving as a surface layer on a bonding side of the die attachment portion to which the semiconductor element is to be bonded;
   providing a silver paste which contains a solvent and silver particles, the silver particles having a residual strain measured by X-ray diffractometry of at least 5.0% and a volume-based 50% cumulative diameter of at least 100 nm and no greater than 50 μm;
   applying the silver paste onto the die attachment portion of the substrate;
   forming a layered body by superposing the semiconductor element on the die attachment portion with the silver paste therebetween; and
   bonding the semiconductor element and the substrate using the silver paste by heating the layered body to form a bonding layer from the silver paste, the bonding layer containing: porous silver sintered bodies constituted by the silver particles; and silver nanoparticles with a number average primary particle diameter of at least 1 nm and no greater than 20 nm.

2. The bonding structure production method according to claim 1, wherein
   a percentage content of the silver particles in the silver paste is at least 85% by mass and no greater than 95% by mass relative to a total mass of the silver paste.

3. The bonding structure production method according to claim 1, wherein
   the silver particles have a residual strain measured by the X-ray diffractometry of no greater than 20.0%.

4. The bonding structure production method according to claim 1, wherein
   the silver particles are flakey silver particles.

5. The bonding structure production method according to claim 1, wherein
   the semiconductor element includes no metalized layer that serves for bonding to the substrate.

6. The bonding structure production method according to claim 1, wherein
   in the heating, the layered body is heated without pressure application.

7. The bonding structure production method according to claim 1, wherein
   in the heating, the layered body is heated at a temperature of 150° C. or higher and 350° C. or lower.

8. A bonding structure that constitutes at least a part of a semiconductor module, comprising:
a semiconductor element; a substrate; and a bonding layer that bonds the semiconductor element and the substrate, wherein
the substrate includes a die attachment portion to which the semiconductor element is bonded,
the die attachment portion includes an alumina layer serving as a surface layer on a bonding side of the die attachment portion to which the semiconductor element is bonded,
the bonding layer includes:
porous silver sintered bodies constituted by silver particles with a volume-based 50% cumulative diameter of at least 100 nm and no greater than 50 μm; and
silver nanoparticles with a number average primary particle diameter of at least 1 nm and no greater than 20 nm, and
at least a portion of the silver nanoparticles is bonded to the alumina layer.

9. The bonding structure production method according to claim 1, wherein
the silver nanoparticles bond the alumina layer and the porous silver sintered bodies.

10. The bonding structure production method according to claim 1, wherein
the residual strain of the silver particles is calculated as an arithmetic mean of a residual strain ε1, a residual strain ε2, and a residual strain ε3,
the residual strain ε1 is calculated using the following formula (1) from d1 which represents an interplanar spacing of a (111) plane of silver crystal of the silver particles and $d1_0$ which represents an interplanar spacing of a (111) plane of silver crystal of silver particles with no residual strain,
the residual strain ε2 is calculated using the following formula (2) from d2 which represents an interplanar spacing of a (200) plane of the silver crystal of the silver particles and $d2_0$ which represents an interplanar spacing of a (200) plane of the silver crystals of the silver particles with no residual strain, and
the residual strain ε3 is calculated using the following formula (3) from d3 which represents an interplanar spacing of a (220) plane of the silver crystals of the silver particles and $d3_0$ which represents an interplanar spacing of a (220) plane of the silver crystals of the silver particles with no residual strain:

$$\text{Residual strain } \varepsilon1 = 100 \times (d1-d1_0)/d1_0 \tag{1}$$

$$\text{Residual strain } \varepsilon2 = 100 \times (d2-d2_0)/d2_0 \tag{2}$$

$$\text{Residual strain } \varepsilon3 = 100 \times (d3-d3_0)/d3_0 \tag{3}.$$

11. The bonding structure according to claim 8, wherein the silver nanoparticles bond the alumina layer and the porous silver sintered bodies.

* * * * *